(12) United States Patent
Loisel

(10) Patent No.: US 10,915,489 B2
(45) Date of Patent: Feb. 9, 2021

(54) DEVICE WITH REPROGRAMMABLE SERIAL COMMUNICATION IDENTIFIER

(71) Applicant: Qorvo US, Inc., Greensboro, NC (US)

(72) Inventor: Bradley G. Loisel, Cary, NC (US)

(73) Assignee: Qorvo US, Inc., Greensboro, NC (US)

(*) Notice: Subject to any disclaimer, the term of this patent is extended or adjusted under 35 U.S.C. 154(b) by 134 days.

(21) Appl. No.: 16/138,241

(22) Filed: Sep. 21, 2018

(65) Prior Publication Data

US 2019/0087379 A1 Mar. 21, 2019

Related U.S. Application Data

(60) Provisional application No. 62/561,375, filed on Sep. 21, 2017.

(51) Int. Cl.
| | | |
|---|---|---|
| *G06F 13/42* | (2006.01) | |
| *H03K 17/22* | (2006.01) | |
| *H03K 3/037* | (2006.01) | |

(52) U.S. Cl.
CPC ....... *G06F 13/4282* (2013.01); *H03K 3/0377* (2013.01); *H03K 17/22* (2013.01)

(58) Field of Classification Search
None
See application file for complete search history.

(56) References Cited

U.S. PATENT DOCUMENTS

| | | | | |
|---|---|---|---|---|
| 2015/0106541 A1* | 4/2015 | Southcombe | ....... | G06F 13/4282 710/110 |
| 2016/0182250 A1* | 6/2016 | Pourseyed | ........ | H04L 12/40013 710/316 |
| 2018/0338052 A1* | 11/2018 | Zhou | .................. | H04N 1/00509 |
| 2019/0041452 A1* | 2/2019 | Chang | ................ | G01R 31/2812 |

OTHER PUBLICATIONS

MIPI Alliance, "Draft Application Note for RF Front-End Control Interface (RFFE) v2.0," Application Note Version 2.1, Revision 05, Sep. 6, 2015, 117 pages.
Texas Instruments, "LM8335 General Purpose Output Expander with MIPI® RFFE Host Interface," Data Sheet, Revised May 2013, 21 pages.

\* cited by examiner

*Primary Examiner* — Idriss N Alrobaye
*Assistant Examiner* — Dayton Lewis-Taylor
(74) *Attorney, Agent, or Firm* — Withrow & Terranova, P.L.L.C.

(57) ABSTRACT

A device includes a general-purpose input/output node, a serial identifier register, and serial identifier reassignment circuitry. The serial identifier register stores a serial identifier associated with the device. The serial identifier reassignment circuitry is coupled to the general-purpose input/output node and the serial identifier register. The serial identifier reassignment circuitry sets a bit of the serial identifier based on a steady-state voltage on the general-purpose input/output node. By setting a bit of the serial identifier based on a steady-state voltage on the general-purpose input/output node, the serial identifier may be easily changed using a pull-up or pull-down resistor external to the device.

18 Claims, 4 Drawing Sheets

DEVICE WITH REPROGRAMMABLE SERIAL COMMUNICATION IDENTIFIER

RELATED APPLICATIONS

This application claims the benefit of provisional patent application Ser. No. 62/561,375, filed Sep. 21, 2017, the disclosure of which is hereby incorporated herein by reference in its entirety.

FIELD OF THE DISCLOSURE

The present disclosure relates to devices for serial communication, and specifically to devices for serial communication that have a serial identifier that can be easily reprogrammed.

BACKGROUND

Serial communication busses are widely used to enable communication between devices. To properly function, each one of the devices attached to a serial communication bus must be uniquely identifiable. This is so that data on the serial communication bus can individually address a specific device. FIG. 1 illustrates a conventional serial communication system 10. The conventional serial communication system 10 includes a number of devices 12 (labeled individually as 12A through 12C) coupled to one another via a serial communication bus 14. While not shown, a master device or serial communications management circuitry may be coupled to the serial communication bus 14 in order to facilitate communication between the devices 12. Each one of the devices 12 is associated with a serial identifier. This serial identifier is stored in a serial identifier register 16 on each one of the devices 12. As discussed above, the serial identifier associated with each one of the devices 12 must be unique so that the devices 12 may be individually addressed on the serial communication bus 14. This requirement may be problematic when two or more of the devices 12 are identical parts. Generally, the serial identifier associated with a part is hardcoded at the time of manufacture, and is consistent for a particular part. In other words, identical parts generally have identical serial identifiers that are hardcoded therein at the time of manufacture. Accordingly, if two or more of the devices 12 are identical parts, they will have the same serial identifier and will not be separately addressable on the serial communication bus 14. Manufacturers have previously solved this problem by creating identical parts with different serial identifiers. However, this solution creates significant supply chain problems when considering that both manufacturers of the parts and their customers must maintain separate inventory for identical parts having different serial identifiers. Accordingly, there is a need for devices configured to communicate via a serial communication bus that are capable of easily changing a serial identifier associated therewith so that all devices on a serial communication bus are uniquely identifiable.

SUMMARY

In one embodiment, a device includes a general-purpose input/output node, a serial identifier register, and serial identifier reassignment circuitry. The serial identifier register stores a serial identifier associated with the device. The serial identifier reassignment circuitry is coupled to the general-purpose input/output node and the serial identifier register. The serial identifier reassignment circuitry sets a bit of the serial identifier based on a steady-state voltage on the general-purpose input/output node. By setting a bit of the serial identifier based on a steady-state voltage on the general-purpose input/output node, the serial identifier may be easily changed using a pull-up or pull-down resistor external to the device.

In one embodiment, a device includes a radio frequency (RF) input/output node, a serial identifier register, and serial identifier reassignment circuitry. The serial identifier register stores a serial identifier associated with the device. The serial identifier reassignment circuitry is coupled to the RF input/output node and the serial identifier register. The serial identifier reassignment circuitry sets a bit of the serial identifier based on a steady-state voltage on the RF input/output node. By setting a bit of the serial identifier based on a steady-state voltage on the RF input/output node, the serial identifier may be easily changed using a pull-up or pull-down resistor external to the device.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
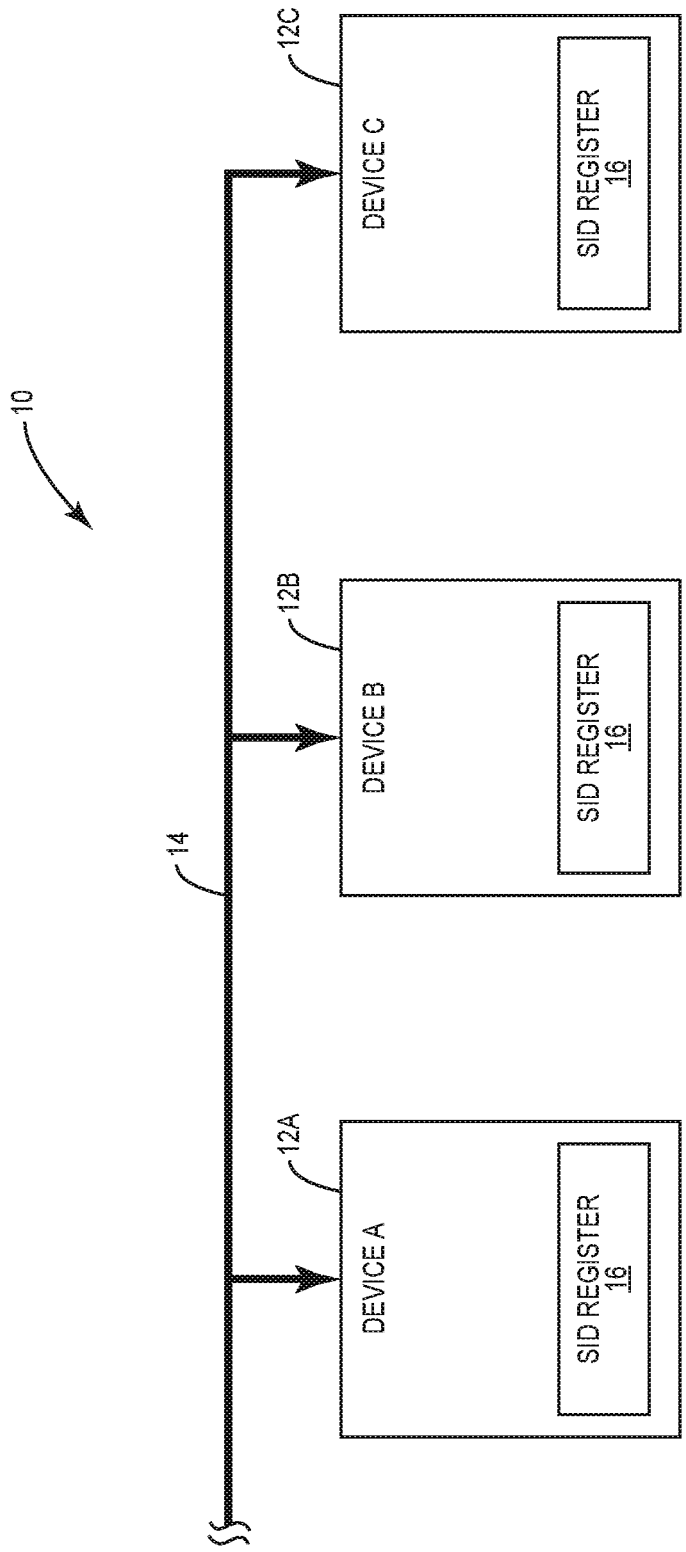
FIG. 1 illustrates a conventional serial communication system.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 2:
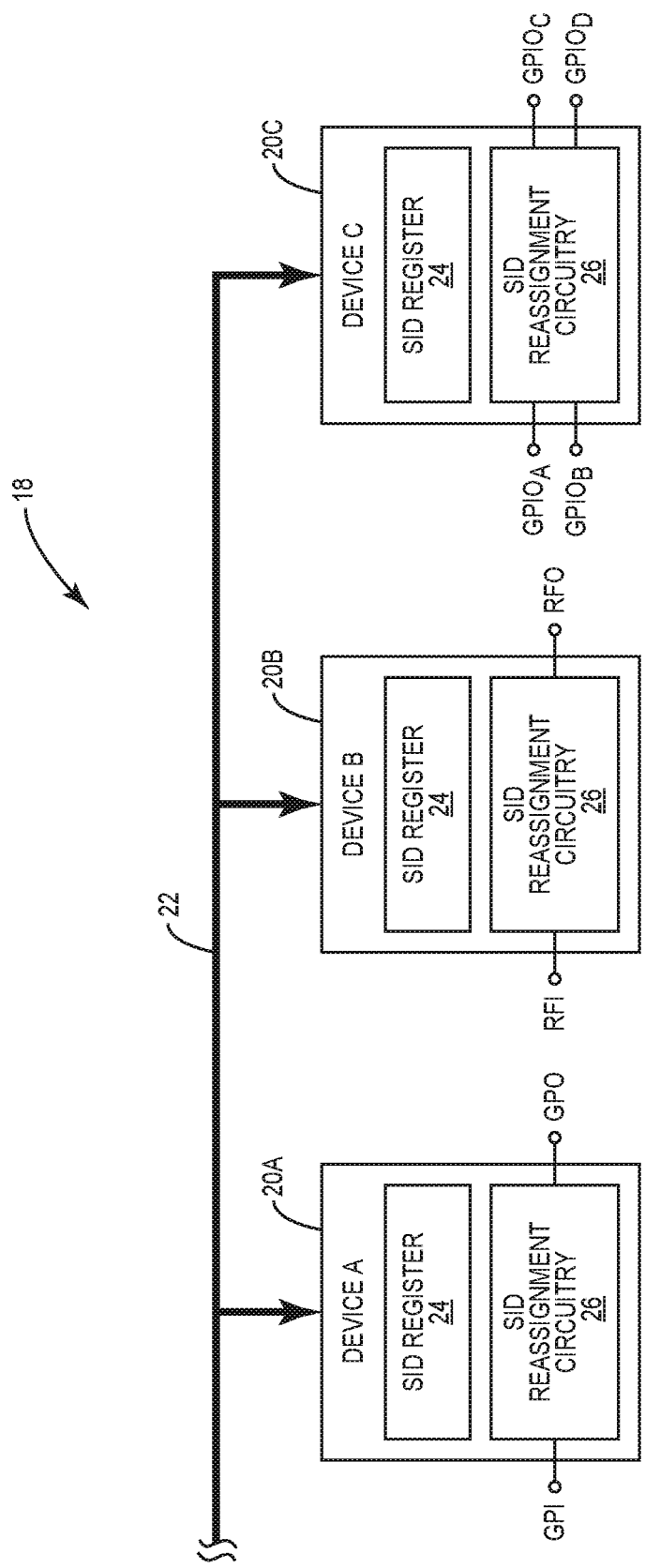
FIG. 2 illustrates a serial communication system according to one embodiment of the present disclosure.

FIG. 2 illustrates a serial communication system 18 according to one embodiment of the present disclosure. The serial communication system 18 includes a number of devices 20 (labelled individually as 20A through 20C) coupled to one another via a serial communication bus 22. In the embodiment shown in FIG. 2, the serial communication bus 22 is a single wire serial bus, however the principles of the present disclosure may be applied to any type of serial bus. While not shown, a master device or serial communications management circuitry may be coupled to the serial communication bus 22 in order to facilitate communication between the devices 20.

Each one of the devices 20 is configured to perform a function, such a processing or otherwise acting on general-purpose input/output signals, processing or otherwise acting on radio frequency (RF) signals, and the like. Accordingly, the devices 20 include a number of input/output nodes that allow them to send and receive signals. To illustrate a few exemplary configurations for the devices 20, a first one of the devices 20A is shown including a general-purpose input node GPI and a general-purpose output node GPO, a second one of the devices 20B is shown including an RF input node RFI and an RF output node RFO, and a third one of the devices 20C is shown including a number of general-purpose input/output nodes (labeled $GPIO_A$ through $GPIO_D$). Notably, these configurations are merely exemplary. Almost endless configurations for the number and type of input/output nodes for each one of the devices 20 exist, all of which are contemplated herein.

Each one of the devices 20 is associated with a serial identifier, which is stored in a serial identifier register 24. As discussed above, it is necessary for the serial identifier for each one of the devices 20 to be unique with respect to every other device on the serial communication bus 22, but this requirement is often difficult to meet when two or more of the devices 20 are identical parts. To solve this problem, each one of the devices 20 includes serial identifier reassignment circuitry 26 coupled between the input/output nodes and the serial identifier register 24. As discussed in detail below, the serial identifier reassignment circuitry 26 sets the serial identifier associated with the device 20 based on a voltage on one or more of the input/output nodes thereof. Accordingly, by attaching an external pull-up resistor or an external pull-down resistor to one or more of the input/output nodes of a device 20, the serial identifier thereof may be changed such that it is unique from one or more of the other devices 20 on the serial communication bus 22.

Figure 3:
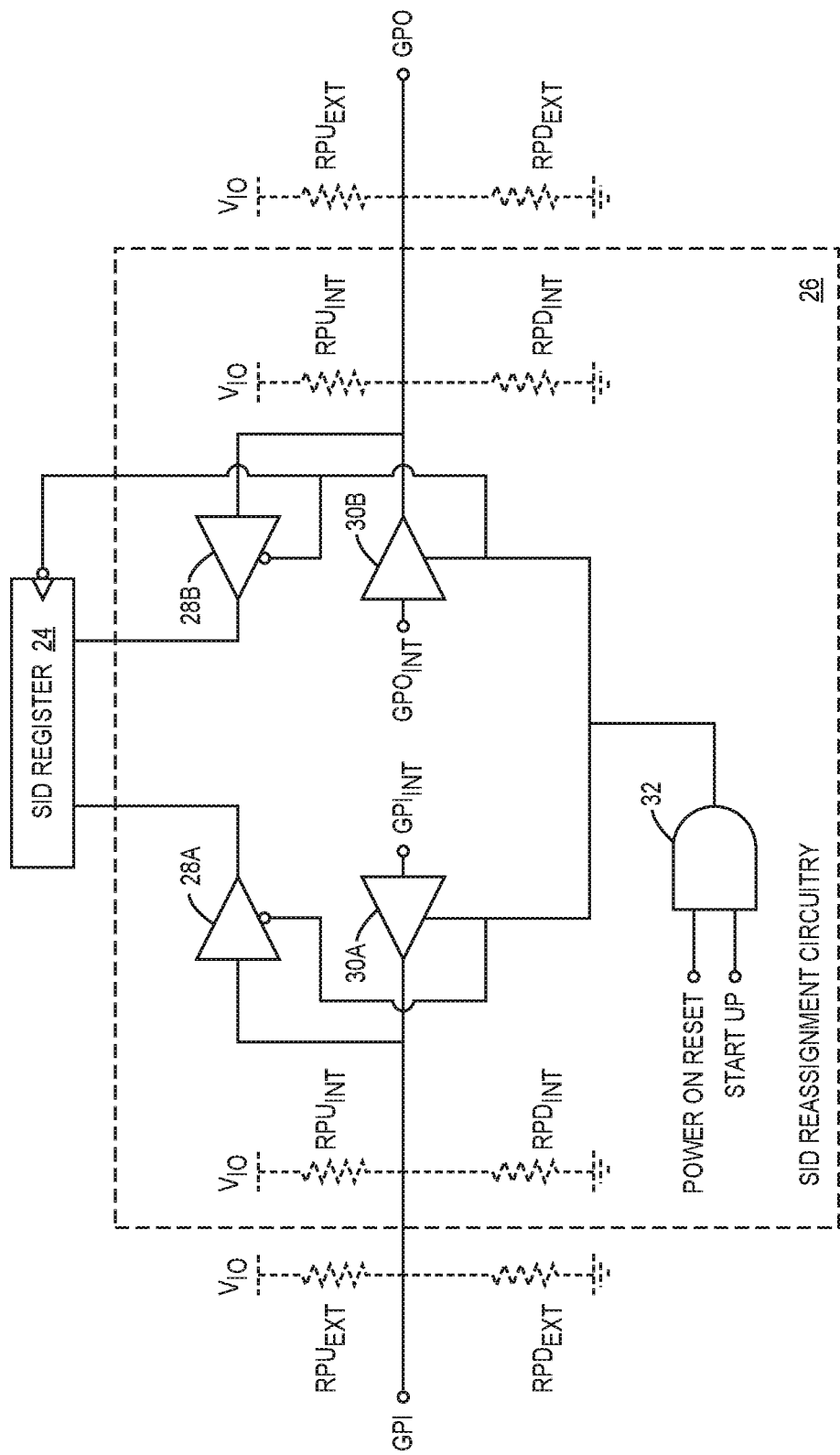
FIG. 3 illustrates serial identifier reassignment circuitry according to one embodiment of the present disclosure.

FIG. 3 shows details of the serial identifier reassignment circuitry 26 according to one embodiment of the present disclosure. As discussed above, the serial identifier reassignment circuitry 26 is coupled between one or more input/output nodes and the serial identifier register 24 of the device 20 in which the serial identifier reassignment circuitry 26 is located. In the exemplary embodiment shown in FIG. 3, the serial identifier reassignment circuitry 26 is coupled between a general-purpose input node GPI and a general-purpose output node GPO, however, those skilled in the art will readily understand that the serial identifier reassignment circuitry 26 may be coupled between any number of input/output nodes of any type (e.g., GPIO, RF input, RF output, RF input/output, etc.), depending on the device 20 in which the serial identifier reassignment circuitry 26 is located. The serial identifier reassignment circuitry 26 includes a first bit reassignment buffer 28A, a second bit reassignment buffer 28B, a first input/output buffer 30A, a second input/output buffer 30B, and buffer selection circuitry 32. The first bit reassignment buffer 28A is coupled between the general-purpose input node GPI and the serial identifier register 24. The second bit reassignment buffer 28B is coupled between the general-purpose output node GPO and the serial identifier register 24. The first input/output buffer 30A is coupled between the general-purpose input node GPI and an associated internal general-purpose input node $GPI_{INT}$, which, while not shown, will be connected to internal circuitry to process or otherwise deal with signals provided at the general-purpose input node GPI. The second input/output buffer 30B is coupled between the general-purpose output node GPO and an associated internal general-purpose output node $GPO_{INT}$, which, while not shown, will be connected to internal circuitry to provide or otherwise deal with signals to be provided at the general-purpose output node GPO. The buffer selection circuitry 32 is coupled to each one of the first bit reassignment buffer 28A, the second bit reassignment buffer 28B, the first input/output buffer 30A, the second input/output buffer 30B, and the serial identifier register 24.

In operation, the buffer selection circuitry 32 receives a power on reset signal and a startup signal, where the power on reset signal indicates that the device 20 in which the serial identifier reassignment circuitry 26 is located is experiencing a power on reset event and the startup signal indicates that the device 20 in which the serial identifier reassignment circuitry 26 is located is starting up. Either one of these signals will cause the buffer selection circuitry 32 to enable the first bit reassignment buffer 28A and the second bit reassignment buffer 28B and disable the first input/output buffer 30A and the second input/output buffer 30B. When the first bit reassignment buffer 28A is enabled, it provides a first bit set signal to the serial identifier register 24 based on a steady-state voltage at the general-purpose input node GPI. The first bit set signal controls the state of a first bit of the serial identifier stored in the serial identifier register 24. When the steady-state voltage at the general-purpose input node GPI is below a threshold value, the first bit set signal will cause the first bit of the serial identifier stored in the serial identifier register 24 to be set to a low value (0), and when the steady-state voltage at the general-purpose input node GPI is above the threshold value the first bit set signal will cause the first bit of the serial identifier stored in the serial identifier register 24 to be set to a high value (1). The first bit reassignment buffer 28A may include a Schmitt trigger input to increase the accuracy of thresholding the steady-state voltage on the general-purpose input node GPI.

Similarly, when the second bit reassignment buffer 28B is enabled, it provides a second bit set signal to the serial identifier register 24 based on a steady-state voltage at the general-purpose output node GPO. The second bit set signal controls the state of a second bit of the serial identifier stored in the serial identifier register 24. When the steady-state voltage at the general-purpose output node GPO is below a threshold value, the second bit set signal will cause the second bit of the serial identifier stored in the serial identifier register 24 to be set to a low value (0), and when the steady-state voltage at the general-purpose output node GPO is above the threshold value the second bit set signal will cause the second bit of the serial identifier stored in the serial identifier register 24 to be set to a high value (1). The second bit reassignment buffer 28B may include a Schmitt trigger to increase the accuracy of thresholding the steady-state voltage on the general-purpose output node GPO.

Notably, the serial identifier register 24 receives the same enable signal as the first bit reassignment buffer 28A and the second bit reassignment buffer 28B. When the serial identifier register 24 is enabled, it allows editing of the serial identifier stored in the serial identifier register 24 by the first bit reassignment buffer 28A and the second bit reassignment buffer 28B as discussed above.

When the first input/output buffer 30A is disabled, it effectively isolates the general-purpose input node GPI from the associated internal general-purpose input node $GPI_{INT}$. When the second input/output buffer 30B is disabled, it effectively isolates the general-purpose output node GPO from the associated general-purpose output node $GPO_{INT}$.

When the buffer selection circuitry 32 does not receive the power on reset signal or the startup signal (i.e., when the device 20 in which the serial identifier reassignment circuitry 26 is located is not experiencing a power on reset event or starting up), it will cause the buffer selection circuitry 32 to disable the first bit reassignment buffer 28A and the second bit reassignment buffer 28B while enabling the first input/output buffer 38A and the second input/output buffer 38B. When the first input/output buffer 30A is enabled, it passes signals between the general-purpose input node GPI and the associated internal general-purpose input node $GPI_{INT}$ such that the device 20 in which the serial identifier reassignment circuitry 26 is located functions normally. Similarly, when the second input/output buffer 30B is enabled, it passes signals between the general-purpose output node GPO and the associated internal general-purpose output node $GPO_{INT}$ such that the device 20 in which the serial identifier reassignment circuitry 26 is located functions normally.

When the first bit reassignment buffer 28A is disabled, it effectively isolates the general-purpose input node GPI from the serial identifier register 24. When the second bit reassignment buffer 28B is disabled, it effectively isolates the general-purpose output node GPO from the serial identifier register 24. When the serial identifier register 24 is disabled, it does not allow editing of the serial identifier stored in the serial identifier register 24.

In summary, the serial identifier reassignment circuitry 26 sets the serial identifier for the device 20 in which the serial identifier reassignment circuitry 26 is located based on the steady-state voltage at the input/output nodes utilized by the circuitry every time the device 20 experiences a power on reset event or is starting up. After a power on reset event or startup, the serial identifier is statically stored in the serial identifier register 24 until another power on reset event or startup occurs. As discussed below, this allows for easy reconfiguration of the serial identifier to ensure that all devices on a particular serial communication bus have a unique serial identifier.

The first bit reassignment buffer 28A and the second bit reassignment buffer 28B may be digital buffers with Schmitt input triggers. The first input/output buffer 30A and the second input/output buffer 30B may be digital buffers. The buffer selection circuitry 32 may be a Boolean AND logic gate. An enable signal input to each one of the first bit reassignment buffer 28A, the second bit reassignment buffer 28B, and the serial identifier register 24 may be inverted with respect to the first input/output buffer 30A and the second input/output buffer 30B such that the first bit reassignment buffer 28A, the second bit reassignment buffer 28B, and the serial identifier register 24 are enabled in a complementary fashion with the first input/output buffer 30A and the second input/output buffer 30B as discussed above. Those skilled in the art will appreciate that the configuration for the serial identifier reassignment circuitry 26 in FIG. 3 is merely exemplary. Many different circuit topologies for accomplishing the same function may exists, all of which are contemplated herein.

A default steady-state voltage for each one of the general-purpose input node GPI and the general-purpose output node GPO may be set with one of an internal pull-up resistor $RPU_{INT}$ and an internal pull-down resistor $RPD_{INT}$, where the internal pull-up resistor $RPU_{INT}$ is coupled between a voltage source $V_{IO}$ and the node and the internal pull-down resistor $RPD_{INT}$ is coupled between ground and the node. These default steady-state voltages may be overridden with one of an external pull-up resistor $RPU_{EXT}$ and an external pull-down resistor $RPD_{EXT}$. Generally, the manufacturer will choose whether to use an internal pull-up resistor $RPU_{INT}$ or an internal pull-down resistor $RPD_{INT}$ for each input/output node, which will set the default bits of the serial identifier for the device. A user may override bits of the serial identifier by choosing to provide an external pull-up resistor $RPU_{EXT}$ or an external pull-down resistor $RPD_{EXT}$, which may be easily added to a serial communication system.

By way of example, if there is an internal pull-up resistor $RPU_{INT}$ coupled to a particular input/output node, this will cause the serial identifier reassignment circuitry 26 to set a bit in the serial identifier associated with the input/output node high (1) by default. A user may choose to provide an external pull-down resistor $RPD_{EXT}$ to instead cause the serial identifier reassignment circuitry 26 to set the bit in the serial identifier associated with the input/output node low (0). Conversely, if there is an internal pull-down resistor $RPD_{INT}$ coupled to a particular input/output node, this will cause the serial identifier reassignment circuitry 26 to set a bit in the serial identifier associated with the input/output node low (0) by default. A user may choose to provide an external pull-up resistor $RPU_{EXT}$ to instead cause the serial identifier reassignment circuitry 26 to set the bit in the serial identifier associated with the input/output node high (1). Notably, the external resistor (either pull-up or pull-down) should have a resistance that is significantly less than that of the internal resistor (either pull-up or pull-down), to properly change the steady-state voltage on the input/output node for detection by the serial identifier reassignment circuitry 26. For example, the external resistor (either pull-up or pull-down) should have a resistance that is an order of magnitude less than the internal resistor (either pull-up or pull-down). Further, the value of both the internal and external resistors should be chosen such that the RC time constant associated with the input/output node is low enough to ensure that the bit associated with the input/output node can be properly set during a power on reset event or during startup.

Due to their relatively high resistance, the internal and external resistors (pull-up or pull-down) minimally interfere with the normal operation of the device 20. Those skilled in the art will appreciate that there is a one-to-one relationship between the number of input/output nodes utilized by the serial identifier reassignment circuitry 26 and the number of bits that can be changed in the serial identifier. Popular serial communications systems today often utilize a serial identifier that is four bits in length. Accordingly, utilizing four input/output nodes in the serial identifier reassignment circuitry 26 provides the maximum amount of flexibility in terms of serial identifier reassignment, however, such flexibility comes at the cost of a slight increase in complexity.

Figure 4:
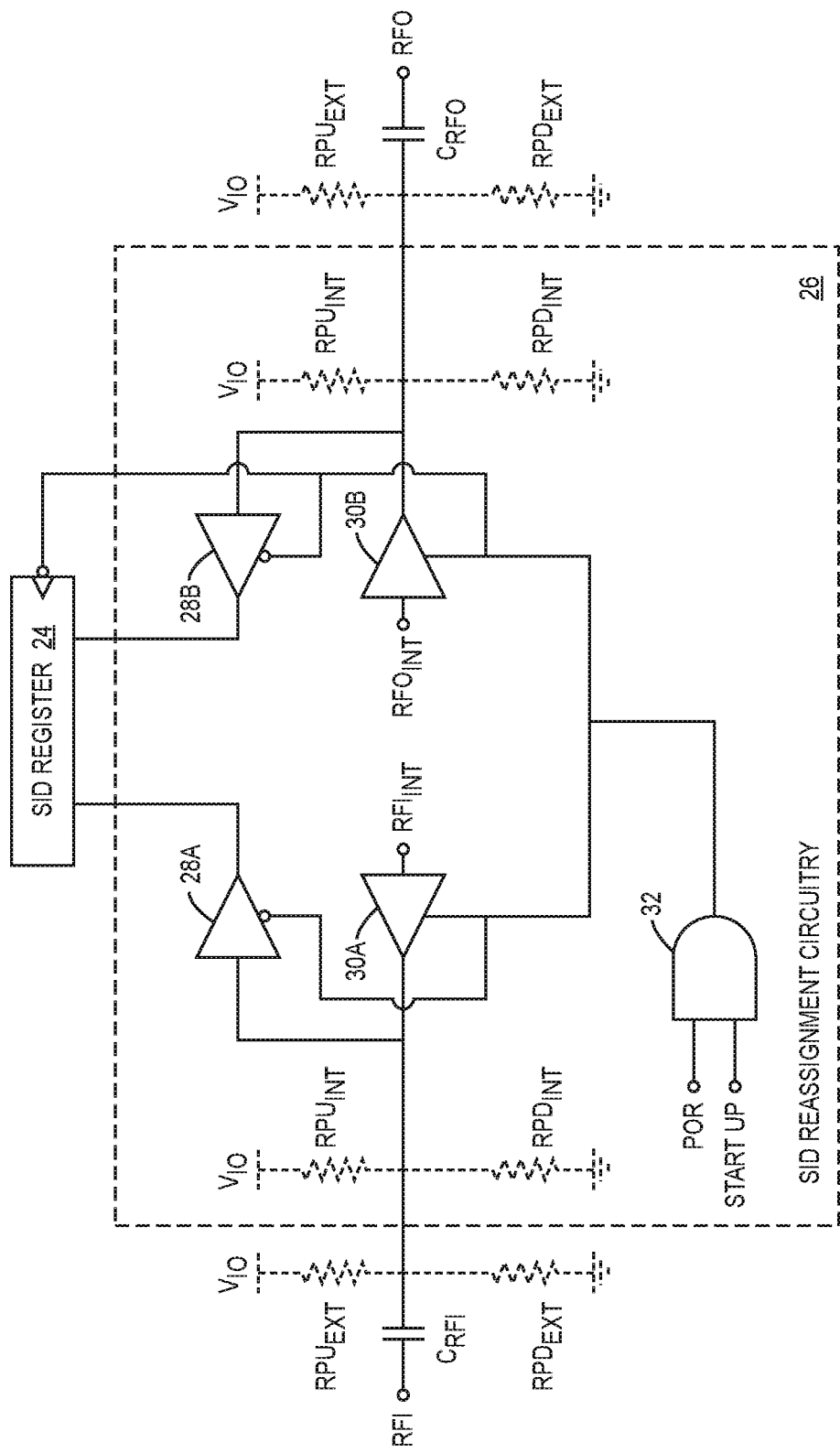
FIG. 4 illustrates serial identifier reassignment circuitry according to one embodiment of the present disclosure.

As discussed above, the input/output nodes for each device 20 may have a different purpose and thus may be general-purpose input nodes, general-purpose output nodes, RF input nodes, RF output nodes, and GPIO nodes. For purposes of illustration, FIG. 4 illustrates the serial identifier reassignment circuitry 26 according to an additional embodiment wherein it is included in a device 20 that has an RF input node RFI and an RF output node RFO rather than a general-purpose input node GPI and a general-purpose output node GPO. As shown, the serial identifier reassignment circuitry is the exact same as the one shown in FIG. 3. However, an RF input capacitor $C_{RFI}$ and an RF output capacitor $C_{RFO}$ are included inline with the RF input node RFI and the RF output node RFO, respectively, for filtering out direct current signals. FIG. 4 illustrates that no matter the type of input/output node utilized by the serial identifier reassignment circuitry 26, the topology and operation thereof remains the same.

Those skilled in the art will recognize improvements and modifications to the preferred embodiments of the present disclosure. All such improvements and modifications are considered within the scope of the concepts disclosed herein and the claims that follow.

What is claimed is:

1. A device comprising:
   a general-purpose input/output node;
   a serial identifier register configured to store a serial identifier associated with the device; and
   a serial identifier reassignment circuitry comprising a bit reassignment buffer coupled between the general-purpose input/output node and the serial identifier register, wherein the serial identifier reassignment circuitry is configured to set a bit of the serial identifier based on a steady-state voltage on the general-purpose input/output node, and wherein the bit reassignment buffer is configured to:
      when enabled, provide a bit set signal to the serial identifier register based on the steady-state voltage on the general-purpose input/output node such that the bit set signal determines the state of a bit of the serial identifier; and
      when disabled, isolate the general-purpose input/output node from the serial identifier register.

2. The device of claim 1 further comprising one of an internal pull-up resistor and an internal pull-down resistor coupled to the general-purpose input/output node, wherein the one of the internal pull-up resistor and the internal pull-down resistor sets a default steady-state voltage on the general-purpose input/output node.

3. The device of claim 2 further comprising one of an external pull-up resistor and an external pull-down resistor coupled to the general-purpose input/output node, wherein the one of the external pull-up resistor and the external pull-down resistor overrides the default steady-state voltage on the general-purpose input/output node.

4. The device of claim 1 wherein the serial identifier reassignment circuitry further comprises an input/output buffer coupled between the general-purpose input/output node and an associated internal general-purpose input/output node and configured to:
   when enabled, pass signals between the general-purpose input/output node and the associated internal general-purpose input/output node; and
   when disabled, isolate the general-purpose input/output node from the associated internal general-purpose input/output node.

5. The device of claim 4 wherein the serial identifier reassignment circuitry further comprises buffer selection circuitry coupled to the bit reassignment buffer and the input/output buffer and is configured to selectively enable one of the bit reassignment buffer and the input/output buffer.

6. The device of claim 5 wherein the buffer selection circuitry is configured to:
   activate the bit reassignment buffer and deactivate the input/output buffer when the device is in one of a power on reset (POR) mode of operation and a startup mode of operation; and
   activate the input/output buffer and deactivate the bit reassignment buffer when the device is not in one of the POR mode of operation and the startup mode of operation.

7. The device of claim 1 wherein the bit reassignment buffer comprises a Schmitt trigger.

8. The device of claim 1 wherein the device comprises a plurality of general-purpose input/output nodes and the serial identifier reassignment circuitry is configured to set a plurality of bits of the serial identifier stored in the serial identifier register based at least in part on a steady-state voltage on each one of the plurality of general-purpose input/output nodes.

9. The device of claim 8 wherein each one of the plurality of general-purpose input/output nodes is associated with a different bit of the serial identifier such that the serial identifier reassignment circuitry is configured to set each bit of the serial identifier based on the steady-state voltage of the associated one of the plurality of general-purpose input/output nodes.

10. A device comprising:
a radio frequency (RF) input/output node;
a serial identifier register configured to store a serial identifier associated with the device; and
a serial identifier reassignment circuitry comprising a bit reassignment buffer coupled between the RF input/output node and the serial identifier register, wherein the serial identifier reassignment circuitry is configured to set a bit of the serial identifier based on a steady-state voltage on the RF input/output node, and wherein the bit reassignment buffer is configured to:
when enabled, provide a bit set signal to the serial identifier register based on the steady-state voltage on the RF input/output node such that the bit set signal determines the state of a bit of the serial identifier; and
when disabled, isolate the RF input/output node from the serial identifier register.

11. The device of claim 10 further comprising one of an internal pull-up resistor and an internal pull-down resistor coupled to the RF input/output node, wherein the one of the internal pull-up resistor and the internal pull-down resistor sets a default steady-state voltage on the RF input/output node.

12. The device of claim 11 further comprising one of an external pull-up resistor and an external pull-down resistor coupled to the RF input/output node, wherein the one of the external pull-up resistor and the external pull-down resistor overrides the default steady-state voltage on the RF input/output node.

13. The device of claim 10 wherein the serial identifier reassignment circuitry further comprises an input/output buffer coupled between the RF input/output node and an associated internal RF input/output node and configured to:
when enabled, pass signals between the RF input/output node and the associated internal RF input/output node; and
when disabled, isolate the RF input/output node from the associated internal RF input/output node.

14. The device of claim 13 wherein the serial identifier reassignment circuitry further comprises buffer selection circuitry coupled to the bit reassignment buffer and the input/output buffer and is configured to selectively enable one of the bit reassignment buffer and the input/output buffer.

15. The device of claim 14 wherein the buffer selection circuitry is configured to:
activate the bit reassignment buffer and deactivate the input/output buffer when the device is in one of a power on reset (POR) mode of operation and a startup mode of operation; and
activate the input/output buffer and deactivate the bit reassignment buffer when the device is not in one of the POR mode of operation and the startup mode of operation.

16. The device of claim 10 wherein the bit reassignment buffer comprises a Schmitt trigger.

17. The device of claim 10 wherein the device comprises a plurality of RF input/output nodes and the serial identifier reassignment circuitry is configured to set a plurality of bits of the serial identifier stored in the serial identifier register based at least in part on a steady-state voltage on each one of the plurality of RF input/output nodes.

18. The device of claim 17 wherein each one of the plurality of RF input/output nodes is associated with a different bit of the serial identifier such that the serial identifier reassignment circuitry is configured to set each bit of the serial identifier based on the steady-state voltage of the associated one of the plurality of RF input/output nodes.

* * * * *